(12) United States Patent
Chen

(10) Patent No.: US 11,837,682 B2
(45) Date of Patent: Dec. 5, 2023

(54) SEMICONDUCTOR DEVICE

(71) Applicant: EPISTAR CORPORATION, Hsinchu (TW)

(72) Inventor: Meng-Yang Chen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 18/075,987

(22) Filed: Dec. 6, 2022

(65) Prior Publication Data

US 2023/0101241 A1  Mar. 30, 2023

Related U.S. Application Data

(63) Continuation of application No. 16/680,183, filed on Nov. 11, 2019, now Pat. No. 11,552,217.

(60) Provisional application No. 62/759,973, filed on Nov. 12, 2018.

(30) Foreign Application Priority Data

Aug. 28, 2019 (TW) .................................. 108130803

(51) Int. Cl.

| H01L 33/06 | (2010.01) |
|---|---|
| H01L 33/50 | (2010.01) |
| H01L 33/36 | (2010.01) |
| H01L 33/30 | (2010.01) |
| H01L 33/10 | (2010.01) |
| H01L 33/46 | (2010.01) |

(52) U.S. Cl.
CPC .............. *H01L 33/06* (2013.01); *H01L 33/10* (2013.01); *H01L 33/30* (2013.01); *H01L 33/36* (2013.01); *H01L 33/46* (2013.01); *H01L 33/50* (2013.01)

(58) Field of Classification Search
CPC ......... H01L 33/06; H01L 33/50; H01L 33/36; H01L 33/30; H01L 33/10; H01L 33/46
See application file for complete search history.

(56) References Cited

U.S. PATENT DOCUMENTS

| 9,847,454 B2 | 12/2017 | Huang et al. |
|---|---|---|
| 11,011,674 B2 | 5/2021 | Bi et al. |
| 11,049,999 B2 | 6/2021 | Hirano et al. |
| 11,152,543 B2 | 10/2021 | Hirano et al. |
| 11,217,726 B2 | 1/2022 | Hirano et al. |

(Continued)

FOREIGN PATENT DOCUMENTS

| CN | 105322064 A | 2/2016 |
|---|---|---|
| TW | 201705522 A | 2/2017 |

*Primary Examiner* — Savitri Mulpuri
(74) *Attorney, Agent, or Firm* — DITTHAVONG, STEINER, & MLOTKOWSKI

(57) ABSTRACT

A semiconductor device is provided, which includes a first semiconductor structure, a second semiconductor structure and a light-emitting structure. The light-emitting structure is located between the first semiconductor structure and the second semiconductor structure. The light-emitting structure includes a first multiple quantum well structure containing aluminum and a plurality of semiconductor stacks. Each of the semiconductor stacks is stacked by a well layer and a barrier layer. The light-emitting structure emits an incoherent light. The well layer and the barrier layer in each of the semiconductor stacks include the same quaternary semiconductor material which includes indium (In). The well layer has a first In content percentage larger than 0.53, and the barrier layer has a second In content percentage less than 0.53.

20 Claims, 10 Drawing Sheets

(56) References Cited

U.S. PATENT DOCUMENTS

| | | |
|---|---|---|
| 2005/0276557 A1 | 12/2005 | Bour et al. |
| 2007/0002915 A1 | 1/2007 | Bean et al. |
| 2007/0221867 A1 | 9/2007 | Beeson et al. |
| 2015/0123152 A1 | 5/2015 | Lin et al. |
| 2020/0287087 A1 | 9/2020 | Watanabe |

SEMICONDUCTOR DEVICE

CROSS REFERENCE TO RELATED APPLICATIONS

This application is a continuation application of U.S. patent application of Ser. No. 16/680,183, filed on Nov. 11, 2019, which claims the right of priority based on U.S. provisional patent application Ser. No. 62/759,973, filed on Nov. 12, 2018 and TW application Serial No. 108130803, filed on Aug. 28, 2019, which also claims the benefit of U.S. provisional patent application Ser. No. 62/759,973, and each of which is incorporated by reference herein in its entirety.

FIELD OF DISCLOSURE

The present disclosure relates to a semiconductor device and in particular to a semiconductor optoelectronic device including a light-emitting structure.

BACKGROUND OF THE DISCLOSURE

In technical fields, such as information transfer and energy transformation, semiconductor devices play important roles. Various researches and developments of related material used in the semiconductor devices have been conducted. For example, a III-V group semiconductor material containing a III-group element and a V-group element may be applied to various optoelectronic devices, such as light emitting diodes (LEDs), laser diodes (LDs), or solar cells. In recent years, the optoelectronic devices are widely applied in fields including lighting, display, communication, sensing and power supply system. The light emitting diodes may be used as a solid-state lighting source and have many advantages, for example, low energy consumption and long operating lifetime. Therefore, the light emitting diodes have been taken place of traditional light sources and widely applied in traffic signs, backlight modules of displays, various lighting or medical devices.

SUMMARY OF THE DISCLOSURE

The present disclosure provides a semiconductor device, which includes a first semiconductor structure, a second semiconductor structure and a light-emitting structure. The light-emitting structure is located between the first semiconductor structure and the second semiconductor structure. The light-emitting structure includes a first multiple quantum well structure containing aluminum and a plurality of semiconductor stacks. Each of the semiconductor stacks is stacked by a well layer and a barrier layer. The light-emitting structure emits an incoherent light. The well layer and the barrier layer in each of the semiconductor stacks include the same quaternary semiconductor material which includes indium (In). The well layer has a first In content percentage larger than 0.53, and the barrier layer has a second In content percentage less than 0.53.

The present disclosure further provides a semiconductor device which includes a first semiconductor structure, a second semiconductor structure, and a light-emitting structure. The first semiconductor structure includes a first cladding layer. The light-emitting structure is located between the first semiconductor structure and the second semiconductor structure. The light-emitting structure includes a first multiple quantum well structure containing a plurality of semiconductor stacks. Each of the semiconductor stacks is stacked by a well layer and a barrier layer. The well layer and the barrier layer in each of the semiconductor stacks include the same quaternary semiconductor material which includes indium (In). The well layer has a first In content percentage larger than 0.53, the barrier layer has a second In content percentage less than 0.53. The first cladding layer comprises phosphorus (P).

DETAILED DESCRIPTION OF THE DISCLOSURE

Figure 1A:
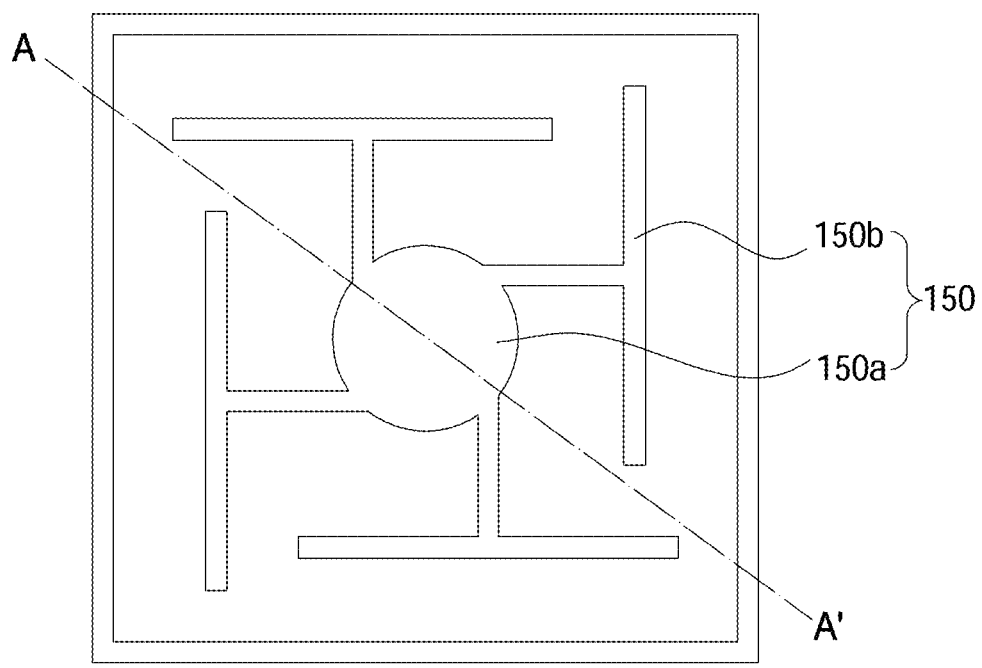
FIG. 1A shows a schematic top view of a semiconductor device in accordance with an embodiment of the present disclosure.

The following embodiments will be described with accompany drawings to disclose the concept of the present disclosure. In the drawings or description, same or similar portions are indicated with same numerals. Furthermore, a shape or a thickness of a component in the drawings may be enlarged or reduced. Particularly, it should be noted that a component which is not illustrated or described in drawings or description may be in a form that is known by a person skilled in the art.

In the present disclosure, if not otherwise specified, the general formula InGaAsP represents $In_{a1}Ga_{1-a1}As_{b1}P_{1-b1}$, wherein $0<a1<1$, and $0<b1<1$; the general formula InGaP represents $In_{a2}Ga_{1-a2}P$, wherein $0<a2<1$; the general formula InGaAs represents $In_{a3}Ga_{1-a3}As$, wherein $0<a3<1$; the general formula AlGaAs represents $Al_{a4}Ga_{1-a4}As$, wherein $0<a4<1$; the general formula AlGaInAs represents $Al_{a5}Ga_{a6}In_{1-a5-a6}As$, wherein $0<a5<1$, and $0<a6<1$; the general formula InGaNAs represents $In_{a7}Ga_{1-a7}N_{a8}As_{1-a8}$, wherein $0<a7<1$, and $0<a8<1$. The content of each element may be adjusted for different purposes, for example, for adjusting the energy gap, or when the semiconductor device is a light-emitting device, the peak wavelength or dominant wavelength may be adjusted. However, the present disclosure is not limited thereto.

A person skilled in the art can realize that addition of other components based on a structure recited in the following embodiments is allowable. For example, if not otherwise specified, a description similar to "a first layer/structure is on or under a second layer/structure" may include an embodiment in which the first layer/structure directly (or physically) contacts the second layer/structure, and may also include an embodiment in which another structure is provided between the first layer/structure and the second layer/structure, such that the first layer/structure and the second layer/structure do not physically contact each other. In addition, it should be realized that a positional relationship of a layer/structure may be altered when being observed in different orientations. Furthermore, in the present disclosure, a description of "a layer/structure only includes X material" means the X material is the only composition in the layer/structure; however, the layer/structure may still contain a dopant or unavoidable impurities.

Qualitative or quantitative analysis of the composition and/or dopant contained in each layer of the semiconductor device of the present disclosure may be conducted by any suitable method, for example, a secondary ion mass spectrometer (SIMS). A thickness of each layer may be obtained by any suitable method, such as a transmission electron microscopy (TEM) or a scanning electron microscope (SEM).

Figure 1B:
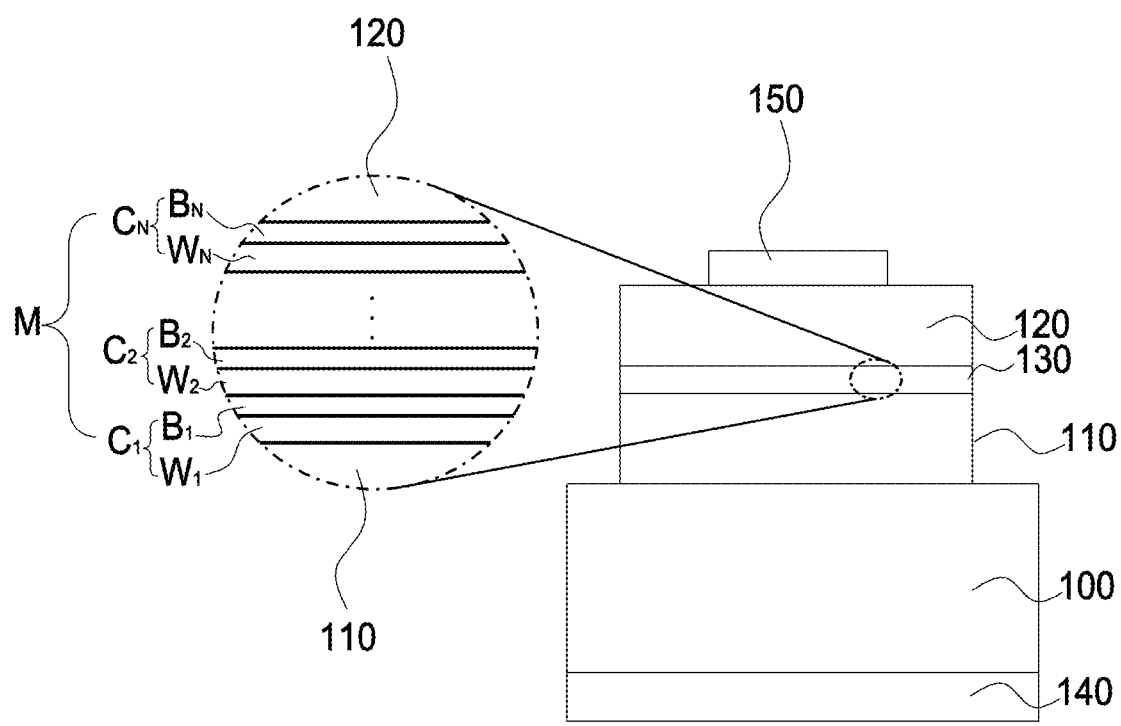
FIG. 1B shows a schematic sectional view and a partial enlargement view of a semiconductor device in accordance with an embodiment of the present disclosure.

FIG. 1A shows a schematic top view of a semiconductor device 10 in accordance with an embodiment. FIG. 1B shows a schematic sectional view and a partial enlargement view of the semiconductor device 10 along A-A' line in FIG. 1A.

As shown in FIG. 1B, the semiconductor device 10 includes a substrate 100, a first semiconductor structure 110, a second semiconductor structure 120, a light emitting structure 130, a first electrode 140, and a second electrode 150. The first semiconductor structure 110 and the second semiconductor structure 120 are located on the substrate 100. The light emitting structure 130 is located between the first semiconductor structure 110 and the second semiconductor structure 120. The first electrode 140 physically contacts the substrate 100 and forms an electrical connection, and the second electrode 150 physically contacts the second semiconductor structure 120 and forms an electrical connection. The first semiconductor structure 110, the second semiconductor structure 120, and the light emitting structure 130 can be obtained by epitaxial growth. The method of epitaxial growth includes metal-organic chemical vapor deposition (MOCVD), hydride vapor phase epitaxy (HVPE), molecular beam epitaxy (MBE), or liquid-phase epitaxy (LPE).

The substrate 100 may include a conductive material, such as gallium arsenide (GaAs), indium phosphide (InP), silicon carbide (SiC) or silicon (Si). The substrate 100 is, for example, a growth substrate for epitaxial growth. In an embodiment, the substrate 100 may be a support substrate which bonds to an epitaxial structure through a bonding layer after the growth substrate is removed.

The first semiconductor structure 110 and the second semiconductor structure 120 are respectively located on two sides of the light emitting structure 130 and are adjacent to the light emitting structure 130. Each of the first semiconductor structure 110 and the second semiconductor structure 120 may be composed of a single layer or multiple layers. The first semiconductor structure 110 and the second semiconductor structure 120 may respectively include a binary, ternary or quaternary III-V semiconductor material, and preferably include a material containing aluminum (Al), gallium (Ga), arsenic (As), phosphorus (P) or indium (In), for example, InP, InAlAs, GaAs, InGaP, AlGaAs, or AlGaInAs. The first semiconductor structure 110 and the second semiconductor structure 120 may have different conductivity types to respectively provide electrons and holes. For example, the first semiconductor structure 110 is n-type and the second semiconductor structure 120 is p-type, or the first semiconductor structure 110 is p-type and the second semiconductor structure 120 is n-type. The conductivity types of the first semiconductor structure 110 and the second semiconductor structure 120 may be adjusted by adding different dopants, for example, magnesium (Mg), zinc (Zn), carbon (C), silicon (Si), or tellurium (Te).

The light emitting structure 130 is located on the substrate 100 and may include a III-V semiconductor material, such as a ternary or quaternary semiconductor material, and preferably include aluminum (Al), gallium (Ga), arsenic (As), phosphorus (P), or indium (In). In an embodiment, the light emitting structure 130 is an undoped semiconductor structure, that is, no other dopants are intentionally added during the formation of the light emitting structure 130. The light emitting structure 130 may include a multiple quantum well structure M. The multiple quantum well structure M may include n semiconductor stacks (or n pairs of semiconductor layers) formed by alternately stacked well layers and barrier layers. Specifically, a pair of semiconductor layers composed of a well layer Wn and a barrier layer Bn may form one semiconductor stack. Each semiconductor stack may be represented by Cn, wherein n=1, 2, 3 . . . , N. In some embodiments, N is preferably a positive integer greater than or equal to 2, and may be a positive integer less than or equal to 20, such as 3, 4, 5, 6, 7, 8, 9, 10, 11, 12, 13, 14, 15, 16, 17, 18, 19 or 20. Each semiconductor stack Cn may be composed of a well layer Wn and a barrier layer Bn adjacent to the well layer Wn, wherein n=1, 2, 3 . . . , N. In an embodiment, the barrier layer Bn in a semiconductor stack Cn in the multiple quantum well structure M has a thickness less than the thickness of the well layer Wn adjacent to the barrier layer Bn. In some embodiments, the thickness of the barrier layer Bn is less than the thickness of the well layer Wn, so as to make carrier distribution in the multiple quantum well structure M more uniform and to improve local recombination of electrons and holes in the multiple quantum well structure M. Accordingly, an internal quantum efficiency (IQE) of the semiconductor device may be elevated. In an embodiment, the ratio of the thickness of the well layer Wn to the thickness of the barrier layer Bn is greater than 1 and less than or equal to 5 in a semiconductor stack Cn, for example, 1.5, 2, 2.5, 3, 3.5, 4, or 4.5. In an embodiment, in at least two semiconductor stacks Cn, the ratio of the thickness of each well layer Wn to the thickness of each barrier layer Bn is greater than 1 and less than or equal to 5. The ratio is, for example, 1.5, 2, 2.5, 3, 3.5, 4 or 4.5. In an embodiment, the ratio of the thickness of the well layer Wn to the thickness of the barrier layer Bn is greater than 1 and less than or equal to 5 in every semiconductor stack Cn, and the ratio is, for example, 1.5, 2, 2.5, 3, 3.5, 4 or 4.5. In some embodiments, the thickness ratio of the barrier layer Bn to the well layer Wn in each semiconductor stack Cn is within a range of 1:1.5 to 1:5, for example, 1:2, 1:2.5, 1:3, 1:3.5, 1:4 or 1:4.5. In some embodiments, the thicknesses of the well layer Wn and the barrier layer Bn are respectively within a range of 1 nm to 20 nm, for example, 1.5 nm, 2 nm, 3 nm, 4 nm, 5 nm, 6 nm, 7 nm, 8 nm, 9 nm, 10 nm, 11 nm, 12 nm, 13 nm, 14 nm, 15 nm, 16 nm, 17 nm, 18 nm, or 19 nm. By having the thickness ratio of the barrier layer Bn to the well layer Wn within the above range, the semiconductor device 10 may have a better light-emitting power. In an embodiment, in at least two semiconductor stacks Cn, the thickness of each barrier layer Bn is greater than the thickness of each well layer Wn. In an embodiment, in every semiconductor stack Cn, the thickness of the barrier layer Bn is greater than the thickness of the well layer Wn in the multiple quantum well structure M.

FIG. 1B shows a partial enlargement view of the multi-quantum well structure M in accordance with an embodiment. As shown in FIG. 1B, in this embodiment, the multiple quantum well structure M includes more than three pairs of semiconductor layers (i.e., n>3), and the multiple quantum well structure M includes a well layer $W_1$, a well layer $W_2$, ..., a well layer $W_N$, a barrier layer $B_1$, a barrier layer $B_2$, ..., and a barrier layer $B_N$. In the embodiment, N is a positive integer greater than or equal to 4. The well layer $W_1$ is adjacent to the first semiconductor structure 110 and in physical contact with the first semiconductor structure 110. The barrier layer $B_N$ is adjacent to the second semiconductor structure 120 and in physical contact with the second semiconductor structure 120. In the embodiment, the well layer $W_1$ and the barrier layer $B_1$ form a semiconductor stack $C_1$, the well layer $W_2$ and the barrier layer $B_2$ form a semiconductor stack $C_2$, and the well layer $W_N$ and the barrier layer $B_N$ form a semiconductor stack $C_N$. In FIG. 1B, only three semiconductor stacks are presented, and other semiconductor stacks are not depicted for the sake of brevity. It should be noted that the light emitting structure 130 is not limited to thereto.

Specifically, the material of the multiple quantum well structure M may include elements like aluminum (Al), gallium (Ga), arsenic (As), phosphorus (P), or indium (In). In an embodiment, the multiple quantum well structure M may include a ternary and/or quaternary semiconductor material (such as InGaAs, InGaAsP, AlGaInAs or InGaNAs). In an embodiment, the multiple quantum well structure M only includes a quaternary semiconductor material (such as InGaAsP, AlGaInAs, or InGaNAs). In an embodiment, the well layer $W_n$ and the barrier layer $B_n$ include the same ternary or quaternary semiconductor material (such as InGaAs, InGaAsP, AlGaInAs or InGaNAs). In an embodiment, the well layer $W_n$ and the barrier layer $B_n$ only include the same quaternary semiconductor material (such as InGaAsP, AlGaInAs, or InGaNAs). In an embodiment, the well layers Wn in all the semiconductor stacks $C_n$ include the same quaternary semiconductor material (such as InGaAsP, AlGaInAs or InGaNAs). For example, the material of the well layer $W_1$ is the same as the material of the well layer $W_2$. In an embodiment, the barrier layers Bn in all the semiconductor stacks $C_n$ include the same quaternary semiconductor material (such as InGaAsP, AlGaInAs or InGaNAs). For example, the barrier layer $B_1$ has the same material as the barrier layer $B_2$. In an embodiment, the well layer $W_n$ and the barrier layer $B_n$ in each semiconductor stack $C_n$ include the same quaternary semiconductor material (such as InGaAsP, AlGaInAs or InGaNAs). For example, the material of the well layer $W_1$, the material of the well layer $W_2$, the material of the barrier layer $B_1$ and the material of the barrier layer $B_2$ can be the same.

In some embodiments, in each semiconductor stack Cn, the well layer Wn is lattice-mismatched with the substrate 100 and has a tensile or compressive strain. In some embodiments, when the well layer Wn has a compressive strain, intervalence band absorption (IVBA) can be reduced, and the quantum efficiency of the semiconductor device can be improved. In some embodiments, in each semiconductor stack Cn, the barrier layer Bn is lattice-mismatched with the substrate 100 and has a tensile or compressive strain. In some embodiments, the barrier layer Bn and the well layer Wn in each semiconductor stack Cn may have the same or opposite strain with respect to the substrate 100. In some embodiments, when the barrier layer Bn has a strain opposite to the well layer Wn, it may have a strain compensation effect, and occurrence of epitaxial defects may be reduced. In some embodiments, the barrier layer Bn has a tensile strain and the well layer Wn has a compressive strain with respect to the substrate 100. In an embodiment, the barrier layer Bn has a compressive strain and the well layer Wn has a tensile strain with respect to the substrate 100. In some embodiments, the well layer Wn and the barrier layer Bn are lattice-mismatched. In an embodiment, a well layer Wn and a barrier layer Bn in a semiconductor stack Cn are lattice-mismatched. In an embodiment, the well layer Wn and the barrier layer Bn in every semiconductor stack Cn in the multiple quantum well structure M are lattice-mismatched. By making the well layer and the barrier layer in the semiconductor device to have a strain with respect to the substrate, a forward voltage value (Vf) of the semiconductor device may be further improved, and the efficiency of the semiconductor device may also be elevated.

In an embodiment, the barrier layer Bn in each semiconductor stack Cn contains aluminum (Al). In an embodiment, in each semiconductor stack Cn, a percentage of aluminum content (Al %) in the barrier layer Bn is greater than a percentage of aluminum content (Al %) in the well layer Wn. In some embodiments, the percentage of aluminum content (Al %) in the barrier layer Bn in the semiconductor stack Cn is greater than the percentage of aluminum content (Al %) in the well layer Wn, and is also greater than the percentage of aluminum content (Al %) in a well layer in an adjacent semiconductor stack (e.g., a semiconductor stack $C_{n+1}$ or $C_{n-1}$). In some embodiments, the percentage of aluminum content (Al %) in the well layer Wn in a semiconductor stack Cn is less than the percentage of aluminum content (Al %) in the barrier layer Bn, and is also less than the percentage of aluminum content (Al %) in a barrier layer in an adjacent semiconductor stack (e.g., a semiconductor stack $C_{n+1}$ or $C_{n-1}$). In some embodiments, the multiple quantum well structure M includes a structure formed by barrier layers and well layers alternately stacked, wherein each barrier layer has an Al % exceeding 50% and each well layer has an Al % less than 50%. In these embodiments, the internal quantum efficiency (IQE) of the semiconductor device may be further improved by making a thickness of the barrier layer Bn smaller than the thickness of the well layer Wn in each of the semiconductor stacks Cn. In some embodiments, the differences in Al % between the two barrier layers or the two well layers in two adjacent semiconductor stacks are preferably less than or equal to 10%.

Specifically, Al % in each barrier layer Bn and each well layer Wn can be obtained by analyzing the barrier layers Bn and the well layers Wn in the light emitting structure 130 with an energy dispersive spectrometer (EDX). The well layers Wn and the barrier layers Bn can be separately measured, and the percentage of aluminum content (Al %) in each barrier layer and the percentage of aluminum content (Al %) in each well layer can be calculated from the measurement results. For example, the barrier layer Bn may include $Al_{x1}Ga_{y1}In_{1-x1-y1}As$, and the well layer Wn may include $Al_{x2}Ga_{y2}In_{1-x2-y2}As$, and the EDX measurement results can obtain x1, y1, x2, and y2 (in atom %), thereby 1-x1-y1 and 1-x2-y2 can be respectively calculated. Here, the aluminum content percentage (Al %) of the barrier layer Bn is defined as Al %=x1/(x1+y1), and the aluminum content percentage (Al %) of the well layer Wn is defined as Al %=x2/(x2+y2)).

In some embodiments, the Al % in the well layer Wn may range from 30% to 35%. In some embodiments, the Al % in the barrier layer Bn may range from 70% to 95%. The ratio of the Al % in the barrier layer Bn to the Al % in the well Wn may be greater than 1 and less than or equal to 3.5, for example, approximately 1.5, 2, 2.5, or 3. In some embodiments, 0<1-x1-y1<0.53. In some embodiments, 1-x1-y1 is, for example, 0.2, 0.25, 0.3, 0.35, 0.4, or 0.45. In some embodiments, x1 fulfills 0.3<x1<0.8. In some embodiments, x1 is, for example, 0.3, 0.35, 0.4, 0.45, 0.5, 0.55, 0.6, 0.65, 0.7, or 0.75. In an embodiment, 1>1-x2-y2>0.53. In some embodiments, 1-x2-y2 is, for example, 0.55, 0.6, 0.65, 0.7, 0.75, 0.8, 0.85, 0.9, or 0.95. In an embodiment, x2 fulfills 0.1<x2<0.2. In some embodiments, x2 is, for example, 0.12, 0.15, or 0.18.

When the semiconductor device 10 is in operation, the light emitting structure 130 can emit a radiation, for example, an infrared light having a peak wavelength in a range of 700 nm to 3000 nm, a red light having a peak wavelength in the range of 610 nm to 700 nm, or a yellow light having a peak wavelength in the range of 530 nm to 570 nm. The radiation is preferably a red or infrared light, such as a near infrared (NIR) light. When the radiation is a near-infrared light, the peak wavelength can be, for example, 720 nm, 810 nm, 850 nm, 910 nm, 940 nm, 1050 nm, 1070 nm, 1100 nm, 1200 nm, 1300 nm, 1400 nm, 1450 nm, 1550 nm, 1600 nm, 1650 nm, 1700 nm, or 2000 nm. The red or infrared light may be an incoherent light or a coherent light.

The first electrode 140 and the second electrode 150 can be electrically connected to an external power source and electrically connected to the light emitting structure 130. The first electrode 140 and the second electrode 150 may include a conductive material. The material of the first electrode 140 and the second electrode 150 may be the same or different, and may include metal oxide, metal, or an alloy. The metal oxide may include indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), indium tungsten oxide (IWO), zinc oxide (ZnO) or indium zinc oxide (IZO). The metal may be germanium (Ge), beryllium (Be), zinc (Zn), gold (Au), platinum (Pt), titanium (Ti), aluminum (Al), nickel (Ni), or copper (Cu). The alloy may include at least two metals selected from the above metal elements, such as GeAuNi, BeAu, GeAu, or ZnAu.

The second electrode 150 may include a main electrode and a plurality of extension electrodes connected to the main electrode. In some embodiments, the plurality of extension electrodes extends from the main electrode toward sides of an upper surface of the semiconductor device 10, such that the current spreading can be improved. In some embodiments, the extension electrodes may include a portion that is parallel or perpendicular to either side of the semiconductor device 10. As shown in FIG. 1A, the semiconductor device may include one main electrode 150a and four extension electrodes 150b. In the embodiment, the main electrode 150a has a circular shape, and each of the extension electrodes 150b has a T-shape. The main electrode 150a may have a width within a range of 50 μm to 150 μm. When the main electrode 150a has a circular shape, the width is defined as its diameter. The extension electrode 150b may have a width within a range of 1 μm to 10 μm. The width of the extension electrode 150b is preferably one tenth or less than the width of the main electrode 150a.

In an embodiment, the second semiconductor structure 120 can optionally include a contact layer (not shown) adjacent to the second electrode 150 for conducting current. The contact layer can be a doped or an undoped semiconductor layer. The contact layer may include a binary semiconductor material, such as GaAs or InP. In an embodiment, the second electrode includes metal or an alloy, and an ohmic contact may be formed between the contact layer and the second electrode 150, such that a contact resistance between the second electrode 150 and the light emitting structure 130 can be further improved.

Figure 1C:
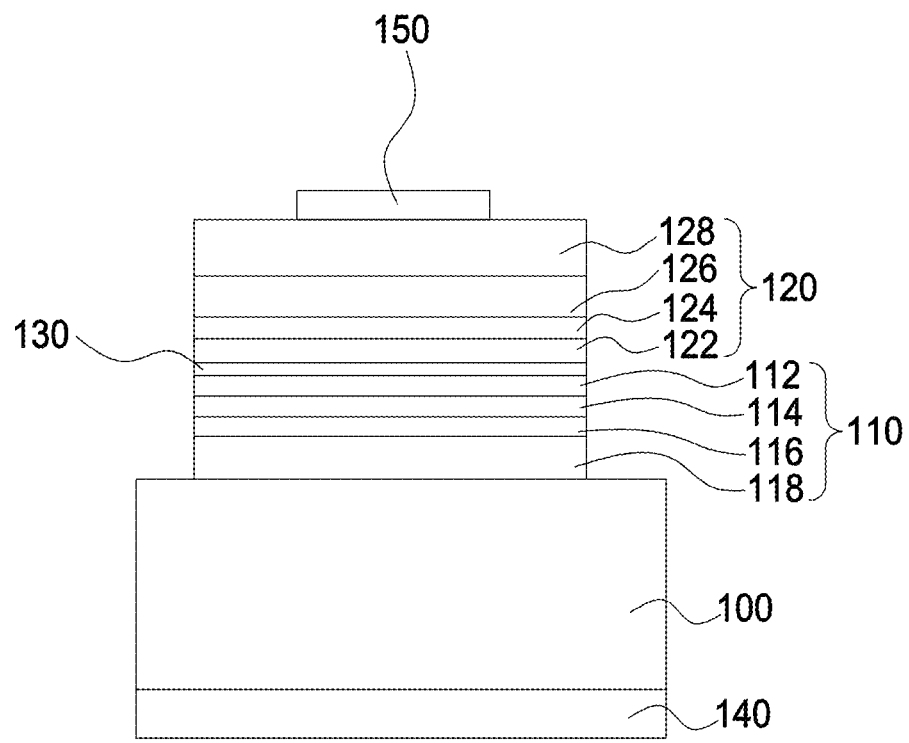
FIG. 1C shows a schematic sectional view of a semiconductor device in accordance with an embodiment of the present disclosure.

FIG. 1C shows a schematic sectional view of a semiconductor device in accordance with an embodiment. In the embodiment, the first semiconductor structure 110 includes a first confinement layer 112, a first cladding layer 114, a second cladding layer 116, and a first window layer 118. In the embodiment, the second semiconductor structure 120 includes a second confinement layer 122, a third cladding layer 124, a fourth cladding layer 126, and a second window layer 128. As shown in FIG. 1C, the first confinement layer 112 and the second confinement layer 122 are adjacent to the light emitting structure 130 and are respectively located at two sides of the light emitting structure 130. The first confinement layer 112 or the second confinement layer 122 may be a doped or an undoped semiconductor layer, and may include the same or different material as the light emitting structure 130. In an embodiment, the first confinement layer 112 and the second confinement layer 122 are preferably undoped and preferably include a quaternary semiconductor material. In an embodiment, the first confinement layer 112 and the second confinement layer 122 include the same material as the light emitting structure 130. In an embodiment, the first confinement layer 112 and the second confinement layer 122 respectively include a ternary or a quaternary semiconductor material, such as InGaAs, InGaAsP, AlGaInAs or InGaNAs. In an embodiment, the first confinement layer 112 and the second confinement layer 122, respectively, only include a quaternary semiconductor material, such as InGaAsP, AlGaInAs, or InGaNAs. In an embodiment, the first confinement layer 112 and the second confinement layer 122 include the same material. In an embodiment, a thickness of the first confinement layer 112 or the second confinement layer 122 is greater than the thickness of the well layer $W_n$ or the barrier layer $B_n$ in the light emitting structure 130. In an embodiment, the thickness of the first confinement layer 112 and the second confinement layer 122 are respectively in the range of 10 nm to 50 nm, for example, 15 nm, 20 nm, 25 nm, 30 nm, 35 nm, 40 nm, or 45 nm.

In the embodiment, the first cladding layer 114 is adjacent to the first confinement layer 112 and located under the first confinement layer 112. In the embodiment, the second cladding layer 116 is adjacent to the first cladding layer 114 and is in physical contact with the window layer 118. The first cladding layer 114 or the second cladding layer 116 may be a doped or an undoped semiconductor layer. In an embodiment, the first cladding layer 114 and the second cladding layer 116 may include aluminum (Al), gallium (Ga), arsenic (As), phosphorus (P), or indium (In). In an embodiment, the first cladding layer 114 or the second cladding layer 116 may respectively include a ternary semiconductor material, such as InAlAs, InGaAs, or InGaP. The first cladding layer 114 or the second cladding layer 116 may include the same material. A thickness of the first cladding layer 114 or the second cladding layer 116 may be greater than the thickness of the first confinement layer 112. In an embodiment, the thickness of the first cladding layer 114 or the second cladding layer 116 is in the range of 50 nm to 800 nm, such as 80 nm, 100 nm, 200 nm, 250 nm, 300 nm, 350 nm, 400 nm, 450 nm, 500 nm, 550 nm, 600 nm, 650 nm, 700 nm or 750 nm. In some embodiments, the material of the first cladding layer 114 and the second cladding layer 116 may be the same. In this case, when the first cladding layer 114 and the second cladding layer 116 are observed by SEM, an interface between the cladding layer 114 and the second cladding layer 116 may be unapparent.

In the embodiment, the third cladding layer 124 is adjacent to the second confinement layer 122 and is located on the second confinement layer 122. In the embodiment, the fourth cladding layer 126 is adjacent to the third cladding layer 124 and is in physical contact with the second window layer 128. The third cladding layer 124 or the fourth cladding layer 126 may be a doped or an undoped semiconductor layer. In an embodiment, the third cladding layer 124 is an undoped semiconductor layer and the fourth cladding layer 126 is a doped semiconductor layer. In an embodiment, the third cladding layer 124 and the fourth cladding layer 126 may respectively include aluminum (Al), gallium (Ga), arsenic (As), phosphorus (P), or indium (In). The third cladding layer 124 and the fourth cladding layer 126 may include the same material. In an embodiment, the third cladding layer 124 and the fourth cladding layer 126 respectively include a ternary semiconductor material, such as InAlAs, InGaAs, or InGaP. A thickness of the third cladding layer 124 or the fourth cladding layer 126 may be greater than the thickness of the second confinement layer 122. In an embodiment, the thickness of the third cladding layer 124 or the fourth cladding layer 126 is in the range of 50 nm to 800 nm, such as 80 nm, 100 nm, 200 nm, 250 nm, 300 nm, 350 nm, 400 nm, 450 nm, 500 nm, 550 nm, 600 nm, 650 nm, 700 nm or 750 nm. In some embodiments, the material of the third cladding layer 124 and the fourth cladding layer 126 may be the same. In this case, when the third cladding layer 124 and the fourth cladding layer 126 are observed by SEM, an interface between the cladding layer 124 and the fourth cladding layer 126 may be unapparent.

In the embodiment, the first window layer 118 is adjacent to the second cladding layer 116 and is located under the second cladding layer 116. The second window layer 128 may be adjacent to the fourth cladding layer 126 and may be located on the fourth cladding layer 126. The first window layer 118 and the second window layer 128 may be transparent to the light emitted by the light-emitting structure, and the first window layer 118 and the second window layer 128 can serve as a light extraction layer to improve the luminous efficiency of the semiconductor device. The first window layer 118 or the second window layer 128 may be a doped or an undoped semiconductor layer. The first window layer 118 and the second window layer 128 may include the same material. In an embodiment, the first window layer 118 and the second window layer 128 may include aluminum (Al), gallium (Ga), arsenic (As), phosphorus (P), or indium (In). In an embodiment, the first window layer 118 and the second window layer 128 may respectively include a binary or ternary semiconductor material, such as GaAs, InP, InAlAs, InGaAs, or InGaP. In an embodiment, the first window layer 118 and the second window layer 128 may be doped and may include the same material as the substrate 100. In an embodiment, the first window layer 118 and the second window layer 128 only include a binary or ternary semiconductor material (such as GaAs, InP, InAlAs, InGaAs, or InGaP). In an embodiment, the second window layer 128 has a thickness greater than the thickness of the first window layer 118. In an embodiment, the first window layer 118 or the second window layer 128 has a thickness in the range of 800 nm to 8000 nm, such as 850 nm, 900 nm, 950 nm, 1000 nm, 1500 nm, 2000 nm, 2500 nm, 3000 nm, 3500 nm, 4000 nm, 4500 nm, 5000 nm, 5500 nm, 6000 nm, 6500 nm, 7000 nm, or 7500 nm.

In an embodiment, the first cladding layer 114, the second cladding layer 116, and the first window layer 118 may be doped by the same dopant to have the same conductivity type, For example, the first cladding layer 114, the second cladding layer 116, or the first window layer 118 may be doped by silicon (Si) to form an n-type semiconductor layer. In an embodiment, a dopant concentration in the first window layer 118 is greater than the dopant concentration in the first cladding layer 114, and the dopant concentration in the first cladding layer 114 is greater than that in the second cladding layer 116. The third cladding layer 124, the fourth cladding layer 126, and the second window layer 128 may be doped with the same dopant to have the same conductivity type. For example, the third cladding layer 124, the fourth cladding layer 126, or the second window layer 128 may be doped with zinc (Zn) to form a p-type semiconductor layer. In an embodiment, the dopant concentration in the second window layer 128 is greater than the dopant concentration in the fourth cladding layer 126, and the dopant concentration in the fourth cladding layer 126 is greater than that in the third cladding layer 124.

In an embodiment, the second cladding layer 116 and/or the first window layer 118 and/or the fourth cladding layer 126 and/or the second window layer 128 may be optionally formed in the semiconductor device 10 based on different application requirements. The positions, compositions or materials of other layers or structures in this embodiment have been described in detail in the previous embodiments, and thus are not described again.

Figure 1D:
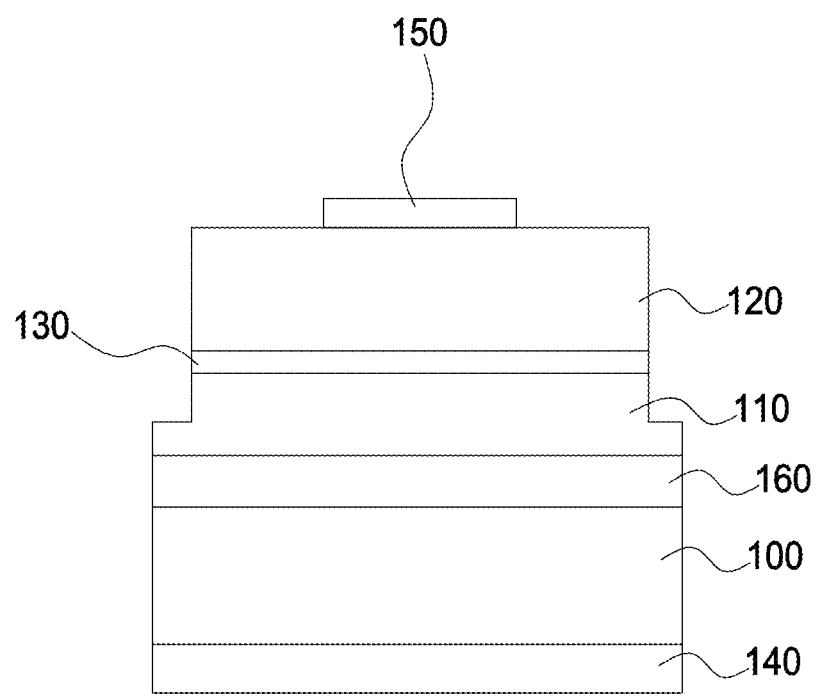
FIG. 1D shows a schematic sectional view of a semiconductor device in accordance with an embodiment of the present disclosure.

FIG. 1D shows a schematic sectional view of a semiconductor device in accordance with an embodiment. In the embodiment, the semiconductor device further includes a reflective structure 160 between the first semiconductor structure 110 and the substrate 100. The reflective structure 160 can be a single layer or multiple layers. In an embodiment, the reflective structure 160 can reflect the light emitted by the light emitting structure 130 towards the second semiconductor structure 120 and out of the semiconductor device. The material of the reflective structure 160 may include metal or an alloy. The metal may be copper (Cu), aluminum (Al), tin (Sn), gold (Au), silver (Ag), lead (Pb), titanium (Ti), nickel (Ni), platinum (Pt), or tungsten (W). The alloy may include at least two selected from the above metals. In an embodiment, the reflective structure 160 can include a Distributed Bragg Reflector structure (DBR). Further, in the embodiment, the first semiconductor structure 110 has a first width on a side near the reflective structure 160 and a second width on a side near the light emitting structure 130, and the first width is larger than the second width. On the side near the reflective structure 160, the first semiconductor structure 110 may have the same width as the reflective structure 160.

In order to avoid redundancy, positions, compositions or material of other layers or structures in the embodiment that have already been mentioned in previous embodiments are not repeatedly described.

Figure 1E:
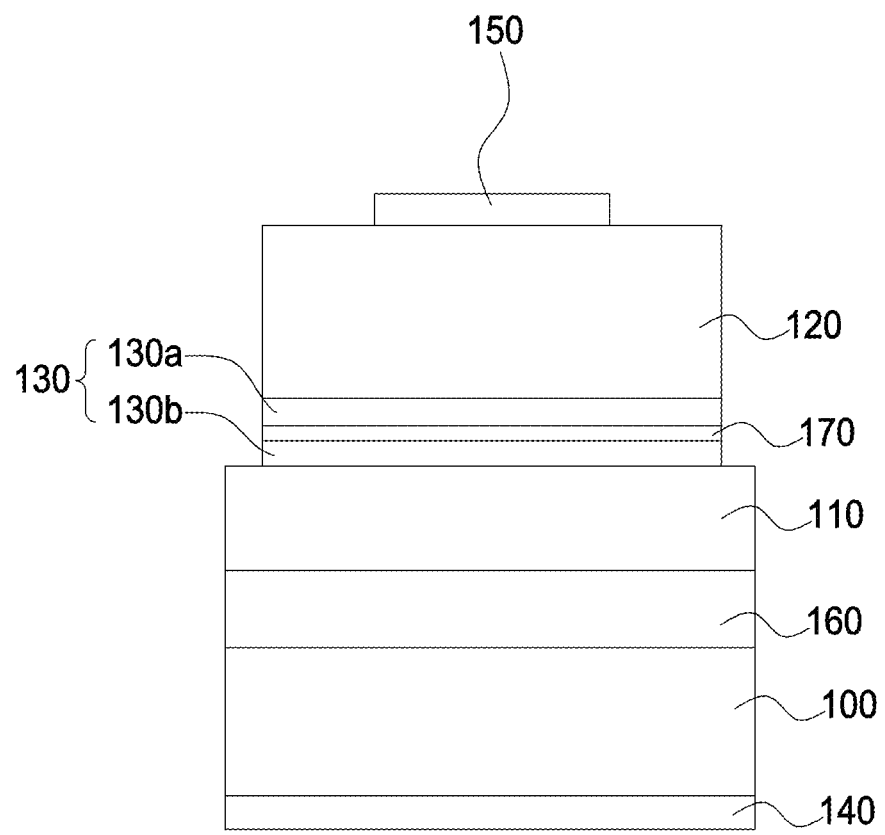
FIG. 1E shows a schematic sectional view of a semiconductor device in accordance with an embodiment of the present disclosure.

FIG. 1E shows a schematic sectional view of a semiconductor device in accordance with an embodiment. In the embodiment, the light emitting structure 130 includes a first active structure 130a and a second active structure 130b. Furthermore, the semiconductor device may further include an intermediate structure 170 between the first active structure 130a and the second active structure 130b. The first active structure 130a and the second active structure 130b may respectively emit a radiation when the semiconductor device is in operation. The radiation can be red light or infrared light. In an embodiment, one of the first active structure 130a and the second active structure 130b emits red light and the other emits infrared light. When the radiation is red light, the peak wavelength may be in the range of 610 nm to 700 nm, such as 630 nm, 640 nm, 650 nm, 660 nm, 670 nm, 680 nm, or 690 nm. When the above radiation is infrared light, the peak wavelength may be in the range of 800 nm to 3000 nm, such as 720 nm, 810 nm, 850 nm, 910 nm, 940 nm, 1050 nm, 1070 nm, 1100 nm, 1200 nm, 1300 nm, 1400 nm, 1450 nm, 1550 nm, 1600 nm, 1650 nm, 1700 nm, or 2000 nm. In an embodiment, the red light or the infrared light may be incoherent or coherent.

The first active structure 130a and the second active structure 130b may include the same material, such as a ternary or quaternary semiconductor material. In an embodiment, the first active structure 130a and the second active structure 130b include the same element, for example, aluminum (Al), gallium (Ga), arsenic (As), phosphorus (P), or indium (In). In an embodiment, the first active structure 130a and the second active structure 130b each includes a multiple quantum well structure. The composition of the multiple quantum well structures can be referred to the description of previous embodiments. In an embodiment, the first active structure 130a or the second active structure 130b has the structure of the multiple quantum well structure as described in previous embodiments. The intermediate structure 170 may electrically connect the first active structure 130a and the second active structure 130b, and may be a single layer or multiple layers. The intermediate structure 170 may include a binary, ternary or quaternary semiconductor material, such as AlAs, InAlAs, AlGaAs, InGaAs, InGaP, InGaAsP, AlGaInAs or InGaNAs. In an embodiment, the conductivity type of the intermediate structure 170 can be adjusted by adding different dopants, such as magnesium (Mg), zinc (Zn), carbon (C), silicon (Si), or tellurium (Te).

In order to avoid redundancy, positions, compositions or material of other layers or structures in the embodiment that have already been mentioned in previous embodiments are not repeatedly described.

Figure 2:
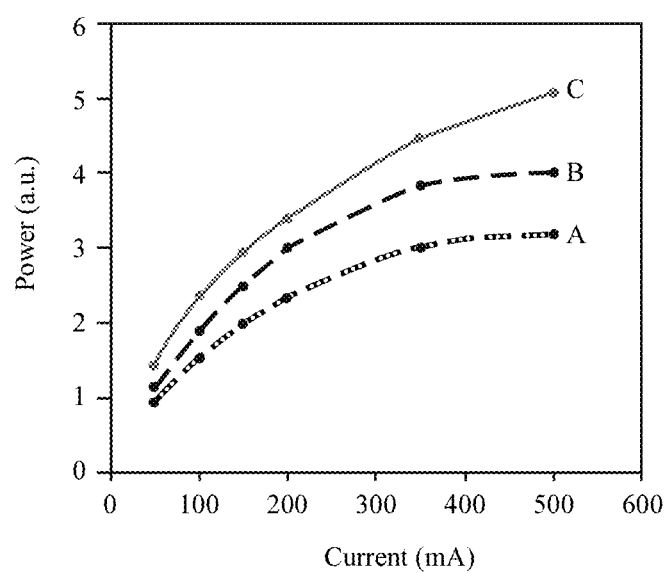
FIG. 2 is a diagram showing the relationship between light-emitting power and current of each of the semiconductor devices A-C in accordance with an experimental example of the present disclosure.

FIG. 2 is a diagram showing the relationship between the light-emitting power and the current of each of semiconductor devices A-C. The semiconductor device A has a structure as shown in FIG. 1B, in which the substrate is an InP substrate and the semiconductor device A has ten semiconductor stacks in the light emitting structure 130, which includes alternated stacked well layers and barrier layers. In the semiconductor devices A-C, each barrier layer includes $Al_{x1}Ga_{y1}In_{1-x1-y1}As$, and each well layer includes $Al_{x2}Ga_{y2}In_{1-x2-y2}As$. In the semiconductor device A, each well layer and each barrier layer have no strain with respect to the substrate. The difference between the semiconductor device B and the semiconductor device A is that in the semiconductor device B, each well layer has a compressive strain with respect to the substrate (in each well layer the percentage of indium content (In %)>0.53), and each barrier layer has no strain with respect to the substrate (i.e. lattice-matched). The difference between the semiconductor device C and the semiconductor device A is that in the semiconductor device C, each well layer has a compressive strain with respect to the substrate (In %>0.53 in each well layer), and each barrier layer has a tensile strain with respect to the substrate (In %<0.53 in each barrier layer). The compositions of the light-emitting structures in the semiconductor devices A-C can be referred to Table 1 below.

TABLE 1

|  | well layer In % = 1 − x2 − y2 | barrier layer In % = 1 − x1 − y1 | well layer thickness (nm) | barrier layer thickness (nm) | number of semiconductor stacks |
| --- | --- | --- | --- | --- | --- |
| Semiconductor device A | 0.53 | 0.53 | 10 | 5 | 10 |
| Semiconductor device B | 0.58 | 0.53 | 10 | 5 | 10 |
| Semiconductor device C | 0.58 | 0.44 | 10 | 5 | 10 |

The light-emitting powers of the semiconductor devices A-C are tested at different currents, and the results are shown in FIG. 2. As shown in FIG. 2, the semiconductor device C has the best performance in light-emitting power at different currents, followed by the semiconductor device B and the semiconductor device A. It can be seen from the experimental results that when the well layer in the multiple quantum well structure has a compressive strain with respect to the substrate, the light-emitting power of the device can be better. Moreover, when the barrier layer and the well layer in the multiple quantum well structure have opposite strains with respect to the substrate, the output power can be further improved, and the brightness of the device can be better.

Figure 3:
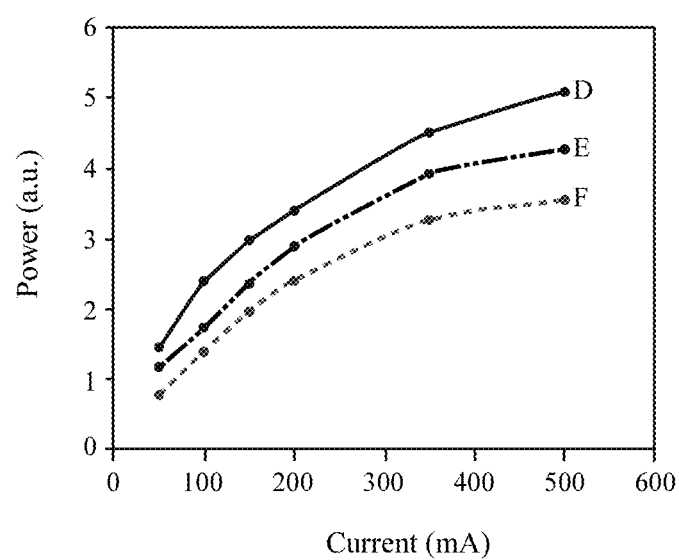
FIG. 3 is a diagram showing the relationship between light-emitting power and current of each of the semiconductor devices D-F in accordance with an experimental example of the present disclosure.

FIG. 3 is a diagram showing the relationship between the light-emitting power and the current of each of semiconductor devices D-F. The semiconductor device E has a structure as shown in FIG. 1B, in which the substrate is an InP substrate, and the semiconductor device E has ten semiconductor stacks in the light emitting structure 130, which includes alternated stacked well layers and barrier layers. In the semiconductor devices D-F, each of the barrier layer includes $Al_{x1}Ga_{y1}In_{1-x1-y1}As$, and each well layer includes $Al_{x2}Ga_{y2}In_{1-x2-y2}As$. In the semiconductor device D, each well layer has a compressive strain with respect to the substrate (In %>0.53 in the well layer), and each barrier layer has a tensile strain with respect to the substrate (In %<0.53 in the barrier layer). In the semiconductor device E, each well layer has a compressive strain (In %>0.53 in the well layer) with respect to the substrate, and each barrier layer has no strain with respect to the substrate (i.e. lattice matched). The difference between the semiconductor device F and the semiconductor device E is that each barrier layer in the semiconductor device F also has a compressive strain with respect to the substrate (In %>0.53 in the barrier layer). The compositions of the light-emitting structures in the semiconductor devices D-F can be referred to Table 2 below.

TABLE 2

| | well layer<br>In % = 1 − x2 − y2 | barrier layer<br>In % = 1 − x1 − y1 | well layer<br>thickness<br>(nm) | barrier<br>layer<br>thickness (nm) | number of<br>semiconductor<br>stacks |
|---|---|---|---|---|---|
| Semiconductor device D | 0.58 | 0.44 | 10 | 5 | 10 |
| Semiconductor device E | 0.58 | 0.53 | 10 | 5 | 10 |
| Semiconductor device F | 0.58 | 0.58 | 10 | 5 | 10 |

The light-emitting powers of the semiconductor devices D-F are tested at different currents, and the results are shown in FIG. 3. As shown in FIG. 3, the semiconductor device D performs better in light-emitting power at different currents, followed by the semiconductor device E and the semiconductor device F. It can be seen from the experimental results that when the barrier layer and the well layer in the multiple quantum well structure have opposite strain conditions with respect to the substrate, the brightness of the device can better. Moreover, when the barrier layer and the well layer have the same strain conditions relative to the substrate (for example, both have a compressive strain or a tensile strain relative to the substrate), some epitaxial defects may be generated in the barrier layer and the well layer. This may affect the internal quantum efficiency (IQE) and the brightness of the device may be poor.

Figure 4:
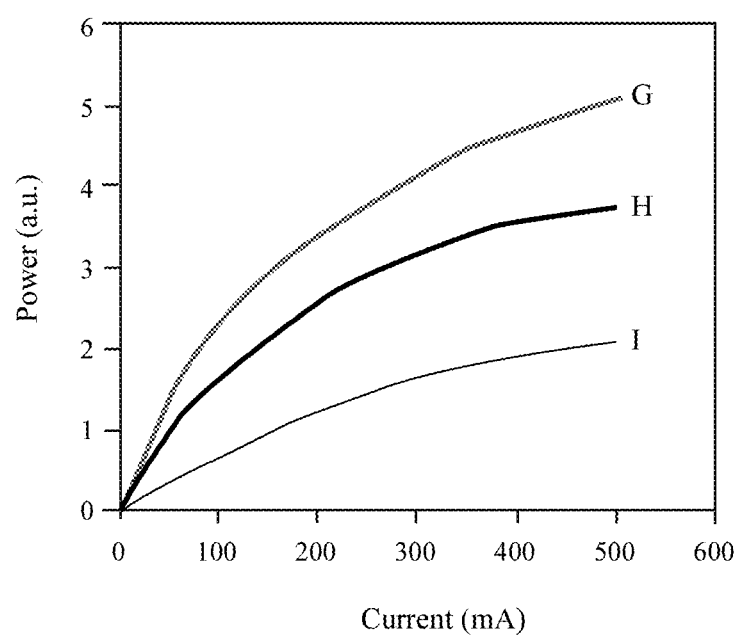
FIG. 4 is a diagram showing the relationship between light-emitting power and current of each of the semiconductor devices G-I in accordance with an experimental example of the present disclosure.

FIG. 4 is a diagram showing the relationship between the light-emitting power and the current of each of the semiconductor devices G-I. Each of the semiconductor devices G-I in the experimental example has a structure as shown in FIG. 1B, in which the substrate is an InP substrate, and each of the semiconductor devices G-I has 10 semiconductor stacks in the light-emitting structure 130, which includes alternately stacked well layers and barrier layers. In the semiconductor devices G-I, each barrier layer includes $Al_{x1}Ga_{y1}In_{1-x1-y1}As$, and each well layer includes $Al_{x2}Ga_{y2}In_{1-x2-y2}As$. Moreover, each well layer has a compressive strain with respect to the substrate (In %>0.53 in the well layer), and each barrier layer has a tensile strain with respect to the substrate (In %<0.53 in the barrier layer). The difference between the semiconductor devices G-I is that the thicknesses of barrier layers are different. The thicknesses of the barrier layers in the semiconductor devices G-I are set to 5 nm, 7 nm, and 10 nm, respectively. The compositions of the light-emitting structures in the semiconductor devices G-I can be referred to Table 3 below.

The light-emitting powers of the semiconductor devices G-I are tested at different currents, and the results are shown in FIG. 4. As shown in FIG. 4, the semiconductor device G has the best performance in light-emitting power at different currents, followed by the semiconductor device H and the semiconductor device I. The forward voltage value (Vf) of the semiconductor device I is slightly higher than that of the semiconductor device G and the semiconductor device H. Specifically, the results show that when the thickness of the well layer is fixed and only the thickness of the barrier layer is changed, reducing the thickness ratio of the barrier layer to the well layer may increase the light-emitting power, and the forward voltage value (Vf) can be further improved. Furthermore, when the thickness ratio of the barrier layer to the well layer is 1:2, the technical effect may be better than the thickness ratio of 7:10 or the thickness ratio of 1:1.

Figure 5:
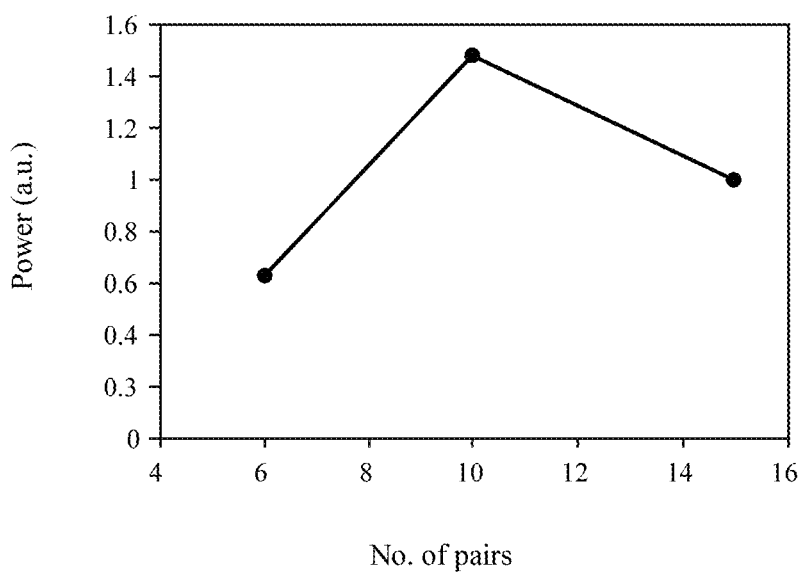
FIG. 5 is a diagram showing the relationship between light-emitting power and the number of the semiconductor stacks in each of the semiconductor devices J-L in accordance with an experimental example of the present disclosure.

FIG. 5 is a diagram showing the relationship between the light-emitting power and the number of the semiconductor stacks in the light-emitting structure 130 of the semiconductor devices J-L in accordance with an experimental example of the present disclosure. Each of the semiconductor devices J-L has a structure as shown in FIG. 1B, in which the substrate is an InP substrate, and the light-emitting structure 130 includes alternately stacked well layers and barrier layers. In the semiconductor devices J-L, each barrier layer includes $Al_{x1}Ga_{y1}In_{1-x1-y1}As$, and each well layer includes $Al_{x2}Ga_{y2}In_{1-x2-y2}As$. Each well layer has a compressive strain with respect to the substrate (In %>0.53 in the well layer), and each barrier layer has a tensile strain with respect to the substrate (In %<0.53 in the barrier layer). The difference between the semiconductor devices J-L is that the numbers of semiconductor stacks in the semiconductor devices J-L are different and are set to 6, 10 and 15, respectively. The composition of the light-emitting structures of the semiconductor devices J-L can be referred to Table 4 below.

TABLE 3

| | well layer<br>In % = 1 − x2 − y2 | barrier layer<br>In % = 1 − x1 − y1 | well layer<br>thickness<br>(nm) | barrier<br>layer<br>thickness (nm) | number of<br>semiconductor<br>stacks |
|---|---|---|---|---|---|
| Semiconductor device G | 0.58 | 0.44 | 10 | 5 | 10 |
| Semiconductor device H | 0.58 | 0.44 | 10 | 7 | 10 |
| Semiconductor device 1 | 0.58 | 0.44 | 10 | 10 | 10 |

TABLE 4

| | well layer In % = 1 − x2 − y2 | barrier layer In % = 1 − x1 − y1 | well layer thickness (nm) | barrier layer thickness (nm) | number of semiconductor stacks |
|---|---|---|---|---|---|
| semiconductor device J | 0.58 | 0.44 | 10 | 5 | 6 |
| semiconductor device K | 0.58 | 0.44 | 10 | 5 | 10 |
| semiconductor device L | 0.58 | 0.44 | 10 | 5 | 15 |

The light-emitting power of the semiconductor devices J-L are tested under the same condition, and the results show that the semiconductor device K having 10 pairs of barrier layers and well layers has the highest brightness, followed by the semiconductor device L and the semiconductor device J. From the result, it can be understood that the brightness of the semiconductor device can be optimized by adjusting the number of semiconductor stacks in the light-emitting structure of the semiconductor device.

Figure 6:
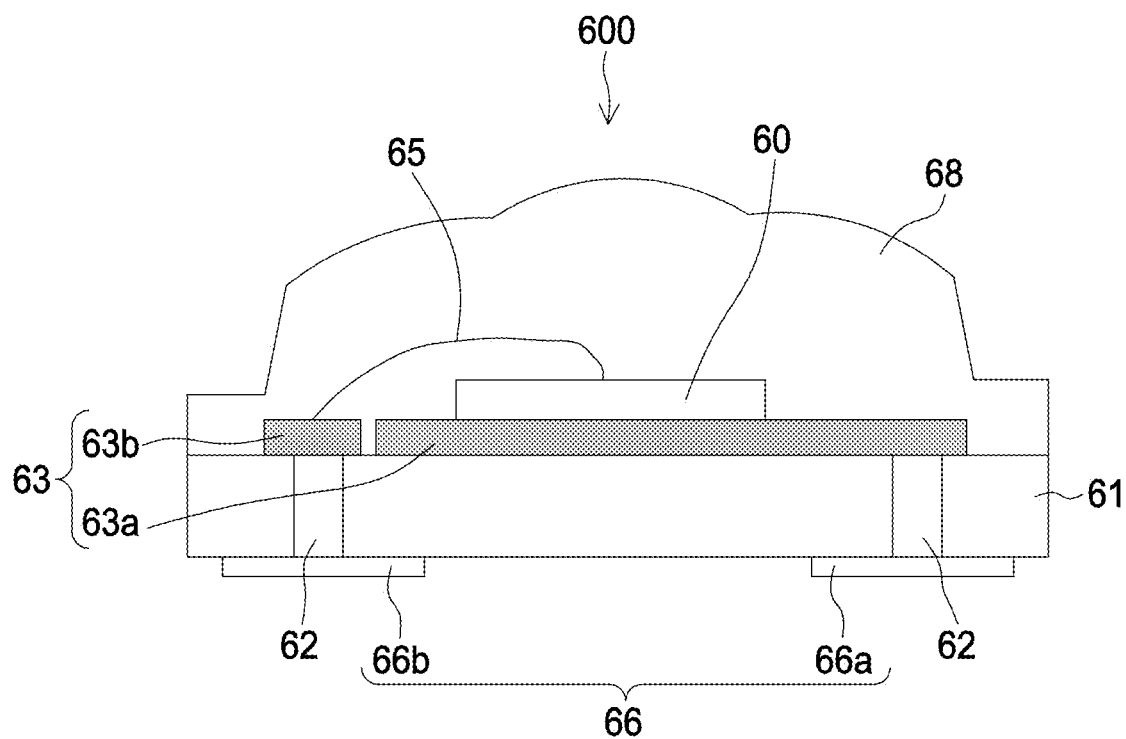
FIG. 6 shows a schematic sectional view of a semiconductor package structure in accordance with an embodiment of the present disclosure.

FIG. 6 shows a schematic sectional view of a semiconductor package structure in accordance with an embodiment of the present disclosure.

As shown in FIG. 6, a package structure 600 which includes a semiconductor device 60, a package substrate 61, a carrier 63, a bonding wire 65, a contact structure 66 and an encapsulating material 68 is provided. The package substrate 61 may include a ceramic or glass. The package substrate 61 has a plurality of through holes 62. Each through hole 62 may be filled with a conductive material such as metal for electrical conduction and/or heat dissipation. The carrier 63 may be located on a surface of one side of the package substrate 61 and may also contain a conductive material such as metal. The contact structure 66 is on a surface on another side of the package substrate 61. In the embodiment, the contact structure 66 includes a first contact pad 66a and a second contact pad 66b, and the first contact pad 66a and the second contact pad 66b can be electrically connected to the carrier 63 through the through holes 62. In an embodiment, the contact structure 66 may further include a thermal pad (not shown), for example, between the first contact pad 66a and the second contact pad 66b. The semiconductor device 60 is located on the carrier 63 and may be the semiconductor device as described in any embodiments of the present disclosure. In the embodiment, the carrier 63 includes a first portion 63a and a second portion 63b, and the semiconductor device 60 is electrically connected to the second portion 63b of the carrier 63 by a bonding wire 65. The material of the bonding wire 65 may include metal, such as gold (Au), silver (Ag), copper (Cu), or aluminum (Al), or may include alloy containing at least one of the above elements. The encapsulating material 68 can cover the semiconductor device 60 and has the effect of protecting the semiconductor device 60. Specifically, the encapsulating material 68 may include a resin material, such as an epoxy resin, or a silicone resin. The encapsulating material 68 may further include a plurality of wavelength conversion particles (not shown) to convert a first light emitted by the semiconductor device 60 into a second light. The wavelength of the second light is greater than the wavelength of the first light.

Based on above, the semiconductor device provided in the present disclosure may have improved optical-electrical characteristics (such as light-emitting power or forward voltage value) and may exhibit relatively high internal quantum efficiency (IQE).

The semiconductor device of the present disclosure can be applied to products in various fields such as illumination, medical care, display, communication, sensing, or power supply system. For example, the semiconductor device can be used in a light fixture, monitor, mobile phone, or tablet, an automotive instrument panel, a television, computer, wearable device (such as watch, bracelet or necklace), traffic sign, outdoor display device, or medical device.

It should be realized that each of the embodiments mentioned in the present disclosure is only used for describing the present disclosure, but not for limiting the scope of the present disclosure. Any obvious modification or alteration is not departing from the spirit and scope of the present disclosure. Furthermore, above-mentioned embodiments can be combined or substituted under proper condition and are not limited to specific embodiments described above. A connection relationship between a specific component and another component specifically described in an embodiment may also be applied in another embodiment and is within the scope as claimed in the present disclosure.

What is claimed is:

1. A semiconductor device, comprising:
a first semiconductor structure;
a second semiconductor structure; and
a light-emitting structure located between the first semiconductor structure and the second semiconductor structure, and including a first multiple quantum well structure containing aluminum and a plurality of semiconductor stacks wherein each of the semiconductor stacks is stacked by a well layer and a barrier layer;
wherein the light-emitting structure emits an incoherent light, the well layer and the barrier layer in each of the semiconductor stacks comprise the same quaternary semiconductor material, the same quaternary semiconductor material comprises indium (In);
wherein the well layer has a first In content percentage larger than 0.53, and the barrier layer has a second In content percentage less than 0.53; and
wherein the first semiconductor structure has a first portion with a first width and a second portion with a second width, the second portion is closer to the light emitting structure than the first portion, and the first width is larger than the second width.

2. The semiconductor device of claim 1, wherein the same quaternary semiconductor material further comprises aluminum.

3. The semiconductor device of claim 1, wherein the well layer has a first Al content percentage, the barrier layer has a second Al content percentage, and a ratio of the second Al content percentage to the first Al content percentage is greater than 1.5.

4. The semiconductor device of claim 1, wherein the first semiconductor structure comprises a first confinement layer, the second semiconductor structure comprises a second confinement layer, the first confinement layer and the second confinement layer are adjacent to the light emitting structure, and the first confinement layer and the second confinement layer have thicknesses larger than a thickness of the well layer or a thickness of the barrier layer.

5. The semiconductor device of claim 4, wherein the thicknesses of the first confinement layer and the second confinement layer are respectively in the range of 10 nm to 50 nm.

6. The semiconductor device of claim 4, wherein the first semiconductor structure further comprises a first cladding layer, and the first cladding layer has a thickness larger than the thickness of the first confinement layer.

7. The semiconductor device of claim 1, further comprising a reflective structure under the first semiconductor structure.

8. The semiconductor device of claim 1, wherein the light-emitting structure emits a radiation which is an infrared light having a peak wavelength in a range of 700 nm to 3000 nm, a red light having a peak wavelength in a range of 610 nm to 700 nm, or a yellow light having a peak wavelength in a range of 530 nm to 570 nm during an operation.

9. The semiconductor device of claim 1, wherein the light-emitting structure further comprises a second multiple quantum well structure and an intermediate structure, and the intermediate structure is located between the first multiple quantum well structure and the second multiple quantum well structure.

10. The semiconductor device of claim 1, wherein the first In content percentage is in a range of 0.55 to 0.95.

11. A semiconductor device, comprising:
a first semiconductor structure comprising a first cladding layer;
a second semiconductor structure; and
a light-emitting structure located between the first semiconductor structure and the second semiconductor structure, and including a first multiple quantum well structure containing a plurality of semiconductor stacks, wherein each of the semiconductor stacks is stacked by a well layer and a barrier layer;
wherein the well layer and the barrier layer in each of the semiconductor stacks comprise the same quaternary semiconductor material, the same quaternary semiconductor material comprises indium (In);
wherein the well layer has a first In content percentage larger than 0.53, and the barrier layer has a second In content percentage less than 0.53, and the first cladding layer comprises phosphorus (P); and
wherein the first semiconductor structure has a first portion with a first width and a second portion with a second width, the second portion is closer to the light emitting structure than the first portion, and the first width is larger than the second width.

12. The semiconductor device of claim 11, wherein the same quaternary semiconductor material further comprises aluminum.

13. The semiconductor device of claim 11, wherein the well layer has a first Al content percentage, the barrier layer has a second Al content percentage, and a ratio of the second Al content percentage to the first Al content percentage is greater than 1.5.

14. The semiconductor device of claim 11, wherein the first semiconductor structure comprises a first confinement layer, the second semiconductor structure comprises a second confinement layer, the first confinement layer and the second confinement layer are adjacent to the light emitting structure, and the first confinement layer and the second confinement layer have thicknesses larger than a thickness of the well layer or a thickness of the barrier layer.

15. The semiconductor device of claim 14, wherein the thicknesses of the first confinement layer and the second confinement layer are respectively in the range of 10 nm to 50 nm.

16. The semiconductor device of claim 14, wherein the second semiconductor structure further comprises a second cladding layer adjacent to the second confinement layer, and the second cladding layer has a thickness larger than the thickness of the second confinement layer.

17. The semiconductor device of claim 11, further comprising a reflective structure under the first semiconductor structure.

18. The semiconductor device of claim 11, wherein the light-emitting structure emits a radiation which is an infrared light having a peak wavelength in a range of 700 nm to 3000 nm, a red light having a peak wavelength in a range of 610 nm to 700 nm, or a yellow light having a peak wavelength in a range of 530 nm to 570 nm during an operation.

19. The semiconductor device of claim 11, wherein the light-emitting structure further comprises a second multiple quantum well structure and an intermediate structure, and the intermediate structure is located between the first multiple quantum well structure and the second multiple quantum well structure.

20. The semiconductor device of claim 11, wherein the first In content percentage is in a range of 0.55 to 0.95.

* * * * *